United States Patent
Graves

(10) Patent No.: US 6,847,235 B2
(45) Date of Patent: Jan. 25, 2005

(54) BUS DRIVER

(75) Inventor: Christopher M. Graves, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/322,894

(22) Filed: Dec. 18, 2002

(65) Prior Publication Data

US 2004/0119510 A1 Jun. 24, 2004

(51) Int. Cl.⁷ .................................................. H03K 5/08
(52) U.S. Cl. ...................... 327/106; 327/112; 327/546; 327/309; 326/30
(58) Field of Search ................................. 327/108, 112, 327/309, 210, 546, 310; 326/30, 86

(56) References Cited

U.S. PATENT DOCUMENTS

| 5,206,544 | A  | * | 4/1993  | Chen et al. ................ 307/443 |
| 6,327,126 | B1 | * | 12/2001 | Miller et al. ................ 361/56 |
| 6,384,671 | B1 | * | 5/2002  | Taguchi et al. ............ 327/541 |
| 6,396,326 | B1 | * | 5/2002  | Chang ........................ 327/309 |

* cited by examiner

*Primary Examiner*—Dinh T. Le
(74) *Attorney, Agent, or Firm*—William B. Kempler; W. James Brady, III; Frederick J. Telecky, Jr.

(57) ABSTRACT

An output driver includes a predriver circuit coupled to a complimentary MOS transistor pair. Third and fourth complimentary MOS transistors are coupled between a source-drain pair of the first and second MOS transistors, respectively and an output. The back gate of at least one of the third and fourth transistors is coupled to the output to provide a lower $V_T$ at the beginning of a transition without creating excessive undershoot or overshoot. A diode is coupled in parallel with the source-drain paths of the third and fourth transistors.

20 Claims, 4 Drawing Sheets

US 6,847,235 B2

BUS DRIVER

FIELD OF THE INVENTION

This invention relates to an output stage and more particularly to output stage for a bus driver circuit.

BACKGROUND OF THE INVENTION

The so-called "totem pole" output stage consisting of a PMOS transistor as the pull-up transistor in series with a NMOS transistor as the pull-down transistor is well known in the art. In many processes in which integrated circuits having this output stage are fabricated, the PMOS transistor has poorer characteristics than the NMOS transistor. Circuit variations to improve the characteristics of this type of output stage are also well known. One such variation is to place a diode in parallel with the PMOS transistor, the diode being conductive when power is applied to it to provide extra boost when the output voltage is low and to gradually turn OFF as the output voltage rises. Another known technique is to use a transistor in parallel with the output transistor, the additional transistor having its gate tied to a buffer which has its input connected to the output voltage. When the output voltage is low, the transistor is driven ON to provide the extra boost to the output circuit and when the output voltage rises to the level at which the inverter switches, the additional transistor is turned OFF. Both of these techniques provide additional output drive abilities during the switching transient but not during the steady state output.

FIG. 1 shows an output waveform for a circuit that has both the additional diode in parallel with the output transistor and the additional transistor in parallel with the output transistor driven by the inverter described above. The load is a transmission line with a characteristic impedance of 65 ohms and a length of 10 centimeters. As can be seen from the waveforms in FIG. 1, the circuit not only exhibits overshoot and undershoot, but exhibits strong noise components both in the high and low portions of the waveform. These noise transitions are probably due to the switching of the additional transistor. In FIG. 1 the nominal curve shows a typical process in the fabrication of the transistors and a typical supply voltage. The strong waveform shows the best process producing transistors having the highest gain and the highest supply voltage. A strong waveform is shown at both −40 degrees Centigrade and +85 degrees Centigrade, the temperature range at which the circuit must operate. The weak waveforms shows the worst case process producing transistors having the lowest gain and the lowest supply voltage. A weak waveform is also shown at −40 degrees Centigrade and +85 degrees Centigrade.

A major problem facing the electronic industry today is its trade-off between speed and noise. As a flow of data on memory busses continues to increase in frequency, the problem of EMI and other noise issues has grown as well. Memory drivers are required to drive high data rates that has caused output edge rates to decrease, especially at low voltages utilizes with advanced process technology. This, in turn, results in higher electromagnetic interference (EMI) and signal noise to cause the receiver to detect false data. Additionally, as voltages drop below 2 volts, and transistor gate thickness is reduced, receivers are more susceptible to damage from overshoots and undershoots. Accordingly, there is a need for an output stage which has reduced propagation delay while maintaining good signal integrity, that is minimizing overshoot and undershoot. In addition, there is a need for such stage which generates a minimum EMI.

SUMMARY OF THE INVENTION

It is a general object of the present invention to provide an output stage for a bus driver. This and other objects and features are provided, in accordance with one aspect of the invention by an output driver circuit comprising a predriver circuit coupled to first and second transistors forming a first complementary MOS transistor pair. The first transistor is coupled to a voltage supply and the second transistor is coupled to a reference voltage supply. Third and fourth transistors form a second complementary MOS transistor pair. The third transistor is coupled between a source-drain path of the first transistor and an output. The fourth transistor is coupled between a source-drain path of the second transistor and the output. A gate of the third transistor and the fourth transistor is coupled to the output and a back gate of at least one of the third and fourth transistors is coupled to the output. First and second diodes are coupled across source-drain paths of the third and fourth transistors.

A second aspect of the invention includes an output driver circuit having first and second transistors forming a first complementary MOS transistor pair output stage and having a diode coupled between each transistor of the first complementary MOS transistor pair and an output. A compensation circuit comprises third and fourth transistors forming a second complementary MOS transistor pair. The third transistor is coupled in parallel to one diode, the fourth transistor is coupled in parallel to the other diode. The gates of each of the third and fourth transistors is coupled to the output and the back gate of one of the third and fourth transistors are coupled to the output.

A third aspect of the invention comprises a method of compensating an output signal generated by a complementary MOS transistor output stage of a driver. A third MOS transistor is coupled between one transistor of the output stage and an output terminal. The third transistor is biased at a gate thereof with voltage at the output terminal. The $V_T$ of the third transistor is controlled as a function of the voltage at the output terminal.

DETAILED DESCRIPTION OF THE PRESENT INVENTION

Figure 2:
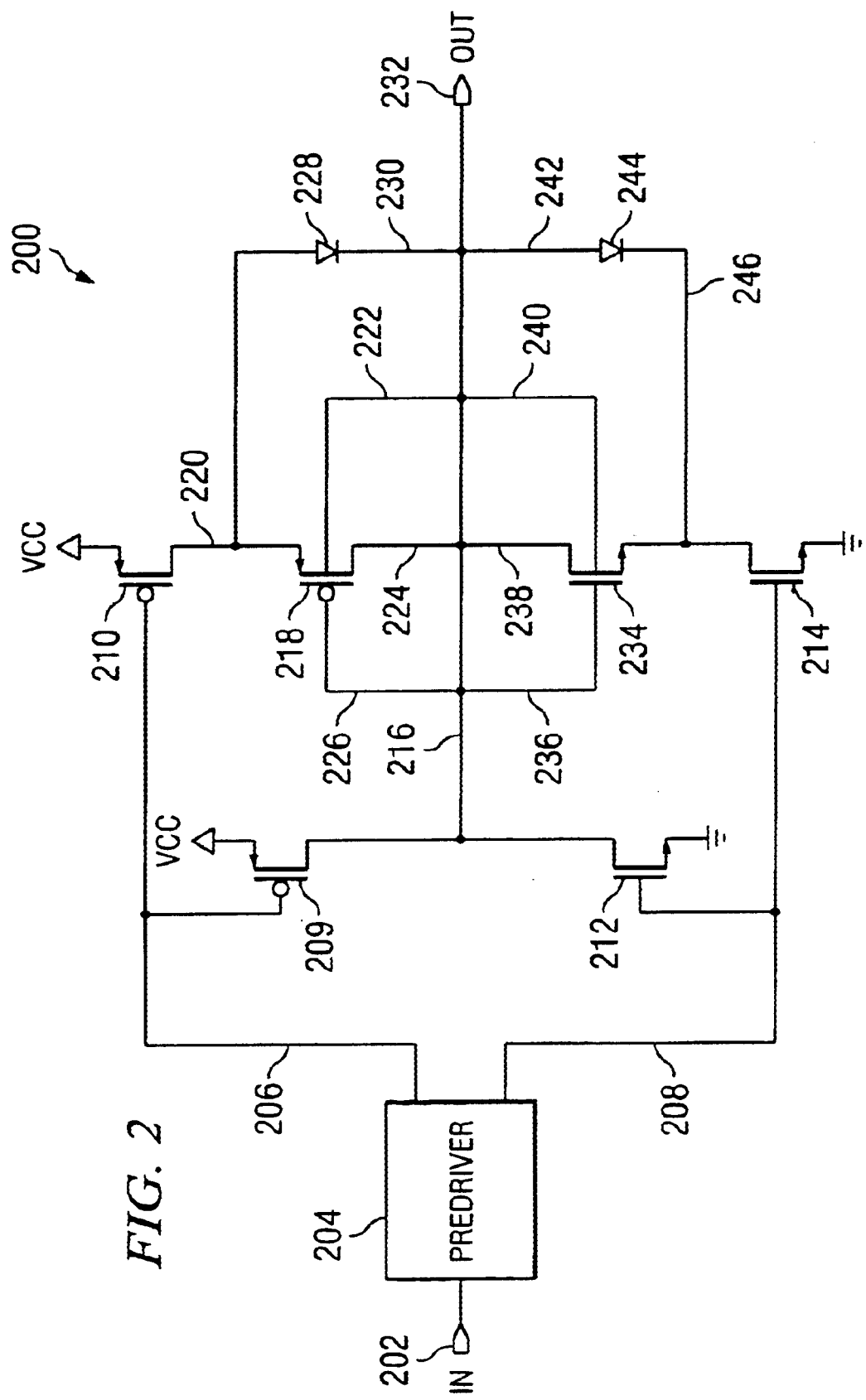
FIG. 2 is a schematic diagram of an output stage in accordance with the present invention.

FIG. 2 shows one embodiment of the present invention generally as 200. An input signal is provided at input terminal 202 which is input to a predriver circuit 204. Predriver circuits suitable for this purpose are well known in the art and need not be described in detail here. The predriver circuit 204 generates a pull-up drive signal on line 206 and a pull-down drive signal on line 208. The pull-up signal on line 206 is coupled to the gate of a PMOS transistor 209 which has its source coupled to a power supply VCC and its drain coupled to an output line 216. The pull-down driver signal on line 208 is coupled to the gate of an NMOS transistor 212 having its drain coupled to the output line 216 and its source coupled to ground. Also coupled to the pull-up driver signal on line 206 is a second PMOS transistor 210 having its source coupled to VCC and its drain coupled to line 220. Line 220 is coupled to the cathode of diode 228, the anode of which is coupled via line 230 to line 216 and the output terminal 232. Line 220 is also coupled to the source of PMOS transistor 218, the drain of which is coupled via line 224 to line 216. The gate of transistor 218 is coupled via line 226 to the output line 216. Line 216 is coupled via line 236 to the gate of NMOS transistor 234. The drain of transistor 234 is coupled via line 238 to the output line 216 as is the back gate via line 240. The source of transistor 234 is coupled to line 246 which is coupled to the anode of diode 244 and to the drain of transistor 214. The cathode of diode 244 is coupled via line 242 to the output line 216. The source of transistor 214 is coupled to ground. The gate of transistor 214 is coupled to the line 208.

In operation, if the signal input to terminal 202 is to drive the output high, predriver 204 generates a signal on line 206 to turn ON transistors 209 and 210. Transistor 209 provides an output onto line 216 to output terminal 232 directly. The output of transistor 210 on line 220 is provided via two paths. The first path comprises diode 228 which conducts heavily initially and has an impedance which increases as the output voltage rises. Transistor 218 is wired as a diode. However, normally the back gate of transistor 218 would be tied to VCC. In the circuit in FIG. 2, however, the back gate is tied via line 222 to the output. This lowers the $V_T$ of the transistor when the output voltage is near zero allowing the transistor to conduct as a diode at a lower forward voltage drop than a conventional diode, such as diode 228. Thus, this provides an increased output boost earlier in the transition from low to high at the output 232. As the output voltage rises, the $V_T$ of the transistor also increases and the transistor functions as a diode, such as diode 228, having an increased impedance and providing a lower contribution to the output. Thus, the increase can be provided at the beginning of the transition while phasing out later in the transition to prevent overshoot.

When the predriver 204 is driving line 206 high to turn transistor 209 and 210 ON, it will also drive line 208 low to turn transistors 212 and 214 OFF. Thus, the lower portion of the circuit does not function when the output is driven from zero volts to VCC.

When the input signal on terminal 202 drives the output 232 from a high to a low state, the predriver circuit 204 will drive line 208 high to turn on transistors 212 and 214. Transistor 212 is connected to line 216 and will pull the voltage on line 216 down. Turning transistor 214 ON places diode 244 between the output voltage and ground via transistor 214. The diode will thus conduct as long as the voltage exceeds the forward voltage drop of the diode and provide a boosted output drive which decreases as the output voltage drops until the output voltage falls below the forward voltage drop of the diode. Transistor 234 is a diode connected transistor and has its back gate tied to the output via line 240. This lowers the $V_T$ of transistor 234 when the output voltage is high, the $V_T$ of the transistor increases as the voltage goes low. Thus, this transistor will provide additional boost to the output drive when the output is high, but its impedance will increase as the output voltage drops in order to avoid undershoot. The predriver will drive line 206 low so that transistors 209, 210 are OFF when the output is driven low.

It should be noted that the diodes 228, 244 which parallel transistors 218 and 234, respectively, also provide temperature compensation for the additional boost circuit. At a temperature of −40 degrees C., the $V_T$S of the transistors increases whereas the forward voltage drop of the diode decreases, which provides temperature compensation to avoid overshoot and undershoot across the temperature range.

Figure 3:
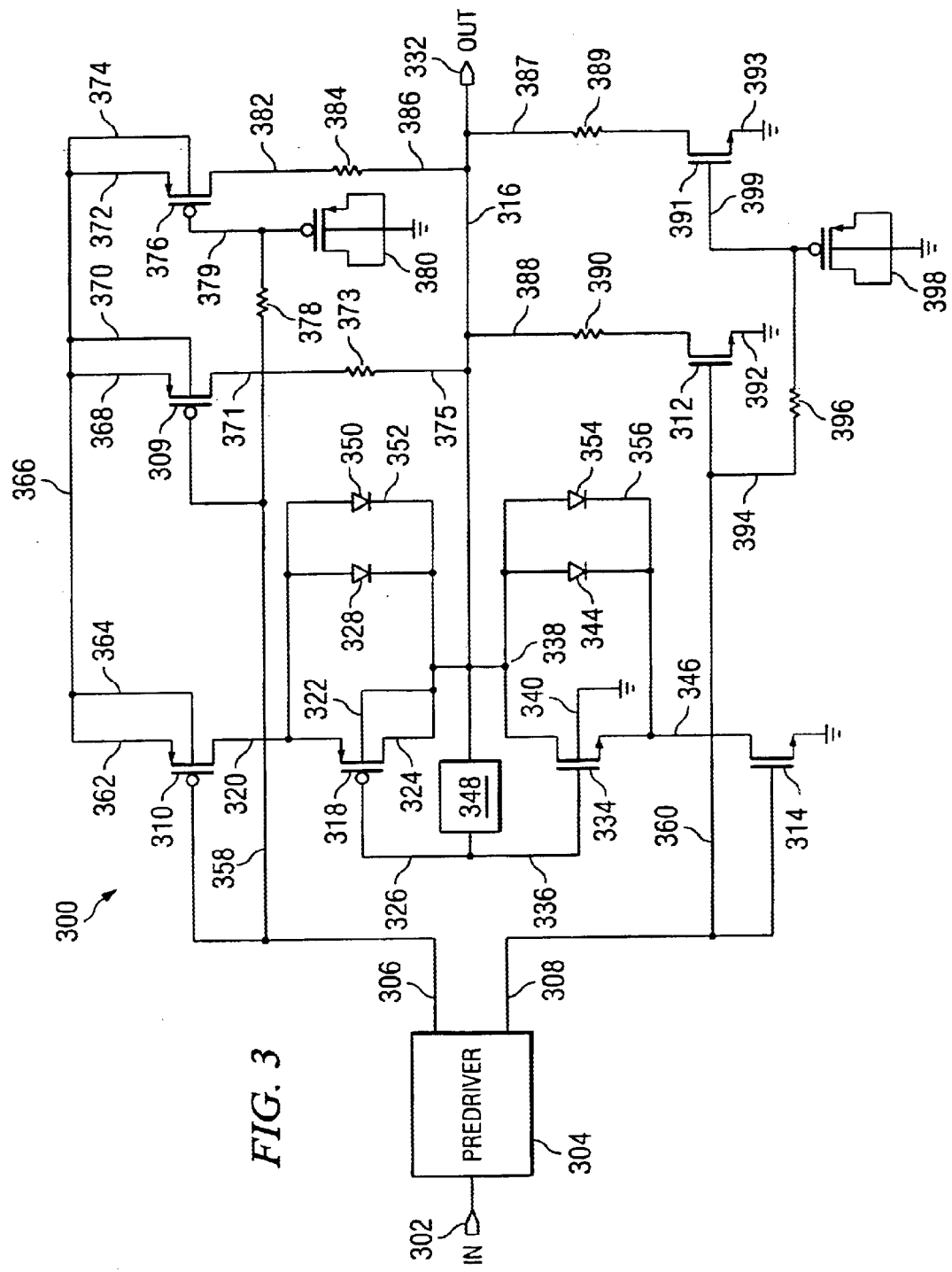
FIG. 3 is a schematic diagram of a second embodiment of the present invention.

A further embodiment of the invention is shown generally as 300 in FIG. 3. An input terminal 302 is connected to the predriver circuit 304 which is similar to the predriver circuit shown in FIG. 2. The predriver circuit 304 has an output 306 which drives the pull-up transistors 309, 310 and 376. Predriver 304 has a second output 308 which drives the pull-down transistors 314, 312 and 391. PMOS transistor 310 thus has its gate connected to line 306; its source is coupled via line 362 to a VCC source 366. The back gate of transistor 310 is coupled by line 364 to the VCC source 366. The drain of transistor 310 is coupled via line 320 to the source of transistor 318, the cathode of diode 328 and the cathode of diode 350. PMOS transistor 309 has its gate coupled to line 306 via line 358 and its source coupled to the VCC source 366 via line 368. The back gate of transistor 309 is coupled to the VCC source 366 via line 370. The drain of transistor 309 is coupled via line 371 to resistor 373 and then via line 375 to the output line 316.

The gate of PMOS transistor 376 is coupled to line 306 via line 358, resistor 378 and line 379. An MOS capacitor 380 is coupled to line 379 and ground potential. The source of transistor 376 is coupled to the VCC source via line 372 and the back gate of the transistor is coupled to the VCC source by line 374. The drain of transistor 376 is coupled to resistor 384 by line 382 and by line 386 to the output line 316.

Output line 316 is coupled to the gate of transistor 318 via electrostatic discharge (ESD) protection circuit 348 and line 326. The ESD circuit 348 protects the gate of transistor 318 from damage due to electrostatic charges that build up on output terminal 332. The drain of transistor 318 is connected to line 316 via line 324 and the back gate of transistor 318 is coupled via line 322 to line 324. The anode of diode 328 is couple to line 324 by line 330 and the anode of diode 350 is coupled to line 324 by line 352.

The output of ESD protection circuit 348 is also coupled via line 336 to the gate of NMOS transistor 334. The source of transistor 334 is coupled to line 346. The drain of transistor 334 is coupled via line 338 to the output line 316. The back gate of transistor 334 is coupled to ground via line 340. Diodes 344 and 354 have a cathode coupled to line 338. The anode of diode 344 is coupled to the drain of transistor 314 via line 346. The anode and diode 354 is coupled to line 346 via line 356. The gate of transistor 314 is coupled to line 308 and the source of transistor 314 is coupled to ground.

The gate of NMOS transistor 312 is coupled to line 308 via line 360. The drain of transistor 312 is coupled to the output line 316 via resistor 390 and line 388. The source of the transistor is coupled to ground via line 392.

NMOS transistor 391 has its gate coupled to line 360 via line 394, resistor 396 and line 399. An MOS capacitor 398 is coupled between line 399 and ground. The drain of transistor 391 is coupled to line 316 via resistor 389 and line 387. The source of the transistor is coupled to ground via line 393.

The resistors 373 and 390 are chosen so that the transistors 309 and 312, respectively, drive the output at the characteristic impedance of a transmission line connected to terminal 332. This impedance may be 65 ohms, for example. The value of resistors 378 and 396 and capacitors 380 and 398 are chosen so that transistors 376 and 391, respectively, do not turn ON until the transition has been substantially completed. Transistors 309, 376 and 312, 391 provided DC (steady state) output of the bus driver. In this embodiment, two diodes 328, 350 and 344, 354 are placed in parallel with the diode connected transistors 318 and 334, respectively, for temperature compensation. It should also be noted that transistor 334 has its back gate connected to ground via line 340 whereas in FIG. 2, the corresponding transistor 234 has its back gate connected to the output via line 240. The reason for the difference between the circuits of FIG. 2 and FIG. 3 are two fold. First of all, as is well know to those skilled in the art, the P-channel transistors are normally weaker, and therefore require a greater boost in order to match the performance characteristics of the N-channel transistors. Secondly, in order to be able to connect the back gate of transistor 334 to the output, transistor 334 must be an isolated transistor, which is not possible with some semiconductor manufacturing processes. If the additional performance obtained by having the back gate of transistor 334 connected to the output is required, a more expensive process must be utilized in which transistor 334 can be isolated. It should also be noted that the bus driver circuit of FIG. 300 may also contain tri-state output circuitry, which is not shown in FIG. 3.

In operation, if a signal on terminal 302 is to drive the output high, predriver 304 will generate a low signal on output line 306. This low signal will drive transistors 309 and 310 ON. Transistor 309 will provide a drive at the characteristic impedance of the transmission line coupled to terminal 332. Transistor 310 will drive the parallel combination of diode connected transistor 318 and diodes 328 and 350. The back gate of transistor 318 is coupled to the output via line 322 so that the $V_T$ of transistor 318 will be reduced when the output voltage is low. As the output voltage increases, the $V_T$ of transistor 318 will increase as will its impedance due to its connection as a diode. Diodes 328 and 350 will conduct as long as they are forward biased to provide additional boost and temperature compensation for transistor 318. Preferably, the $V_T$ of transistor 318, when the output voltage is low, will be lower than the forward voltage drop of diodes 328 and 350 so the transistor will provide a greater boost when the output voltage is zero and both the transistor and the two diodes will be in high impedance states as the voltage approaches VCC, to minimize overshoot. The signal on line 379 will be delayed by the RC time constant formed by resistor 378 and capacitor 380 until the voltage transition to VCC is substantially complete. At this time transistor 376 will turn ON in order to provide the DC or steady state drive requirement of the output stage. When the input signal is to drive the output high, voltage on line 308 will be low and transistors 314, 312 and 391 will be OFF. Thus, no current will flow from the bottom portion of the circuit.

If the input signal on terminal 302 is to drive the output low, the predriver circuit 304 will generate a high voltage on line 308. This voltage will be coupled to the gates of transistors 314 and 312 turning them ON. Transistor 312 will provide an output drive at the characteristic impedance of the transmission line coupled to terminal 332, which may be 65 ohms, for example. Transistor 314 will draw current from the output through transistor 334, diode 344 and diode 354. Transistor 334 is connected as a diode and does not have its back gate coupled to the output line 316. Its $V_T$ will not be enhanced. The diode connected transistor 334 and diodes 344 and 354 will thus conduct until the output voltage falls below their forward voltage drop, at which time they will no longer conduct in order to minimize undershoot. As the output voltage drops, their impedance will increase, so that they will have the greatest effect at the beginning of the transition. Diodes 344 and 354 provide low temperature compensation for the change in $V_T$ of transistor 334 with temperature.

The voltage on the gate of transistor 391 will be delayed by the RC time constant of resistor 396 and MOS capacitor 398. The transistor will not turn on until the transition from the high voltage output to ground is substantially complete. Transistor 391 will turn ON to provide the DC or steady state current drain characteristics of the bus driver.

Figure 1:
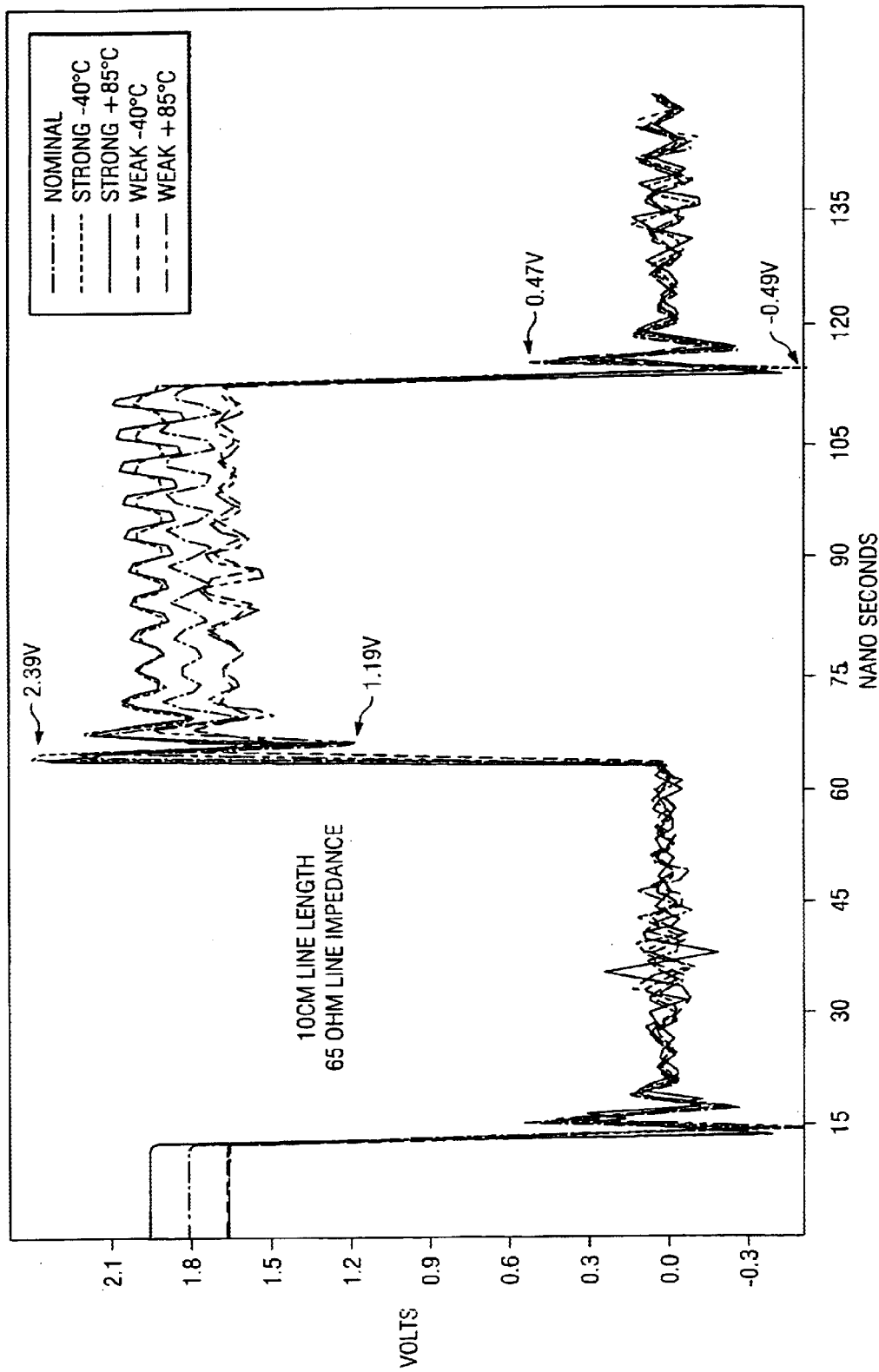
FIG. 1 is simulated output waveform of a known output stage.
Figure 4:
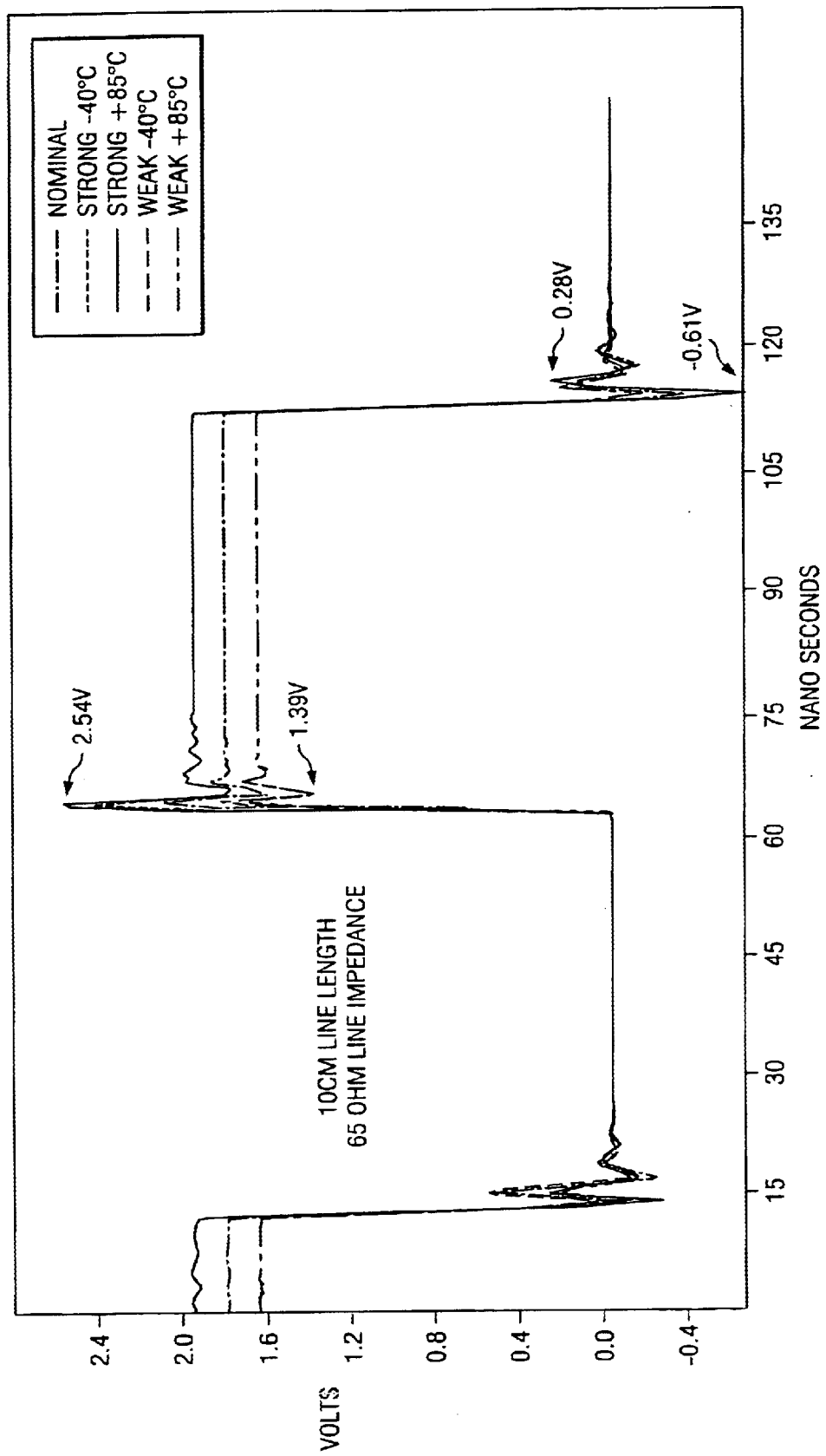
FIG. 4 is the output waveform generated by the circuit in FIG. 3.

Referring now to FIG. 4, an output waveform of the bus driver of FIG. 3 is shown. As with the waveform shown in FIG. 1, the load is a transmission line of 10 cm in length and having a characteristic impedance of 65 ohms. The output curves show both a nominal curve and a strong process curve at −40 degrees centigrade and +85 degrees centigrade as well as a weak process curve at −40 degrees centigrade and +85 degrees centigrade. It is immediately apparent by comparing the waveforms of FIG. 4 with the waveforms of FIG. 1 that there is a marked decrease in noise at both the high and low steady state levels. There is also an improvement in rise time and fall time of 20–30%. For example, for a 1.8 volt circuit operating at 1.65 volts, the transition times for the prior art circuit is approximately 1.6 to 1.7 nanoseconds whereas the transition for the circuit of FIG. 3 is approximately 1.2–1.3 nanoseconds.

While the invention has been particularly shown and described with reference to preferred embodiments thereof, it is well understood by those skilled in the art that various changes and modifications can be made in the invention without departing from the spirit and scope of the invention as defined by the appended claims.

What is claimed is:

1. An output driver circuit for generating an output signal comprising:

a predriver circuit coupled to first and second transistors forming a first complementary MOS transistor pair, the first transistor being coupled to a voltage supply and the second transistor being coupled to a reference voltage supply;

third and fourth transistors forming a second complementary MOS transistor pair, the third transistor being coupled between a source-drain path of the first transistor and an output, the fourth transistor being coupled between a source-drain path of the second transistor and the output, a gate of the third transistor and the fourth transistor being coupled to the output and a back gate of at least one of the third and fourth transistors being coupled to the output;

a steady state output circuit for generating a first portion of the output signal, wherein the first and second complementary MOS transistor pairs provide an additional portion of the output signal during switching transitions of the output signal; and first and second diodes coupled across source-drain paths of the third and fourth transistors.

2. The output driver circuit of claim 1 wherein both the third and fourth transistor have a back gate coupled to the output.

3. The output driver circuit of claim 1 wherein the first and third transistors are PMOS transistors and the second and fourth transistors are NMOS transistors.

4. The output driver circuit of claim 3 wherein the third transistor has a back gate coupled to the output and the back gate of the fourth transistor is coupled to the reference voltage source.

5. The output driver circuit of claim 1 further comprising fifth and sixth transistors forming a third complementary MOS transistor pair, the fifth transistor being coupled between the voltage supply and the output, the sixth transistor being coupled between the output and the reference voltage supply.

6. The output driver circuit of claim 5 wherein the steady state output circuit comprises a third complementary MOS transistor pair.

7. An output driver circuit comprising:
   a predriver circuit coupled to first and second transistors forming a first complementary MOS transistor pair, the first transistor being coupled to a voltage supply and the second transmitter being coupled to a reference voltage supply;
   third and fourth transistors forming a second complementary MOS transistor pair, the third transistor being coupled between a source-drain path of the first transistor and an output, the fourth transistor being coupled between a source-drain path of the second transistor and the output, a gate of the third transistor and the fourth transistor being coupled to the output and a back gate of at least one of the third and fourth transistors being coupled to the output;
   first and second diodes coupled across source-drain paths of the third and fourth transistors;
   fifth and sixth transistors forming a third complementary MOS transistor pair, the fifth transistor being coupled between the voltage supply and the output, the sixth transistor being coupled between the output and the reference voltage supply; and
   seventh and eighth transistors forming a fourth complementary MOS transistor pair, the seventh transistor being coupled between the voltage supply and the output, the eight transistor being coupled between the output and the reference voltage supply.

8. The output driver circuit of claim 7 wherein the fourth complementary MOS transistor pair have an output impedance which is matched to the load.

9. The output driver circuit of claim 8 wherein an output of the third complementary MOS transistor pair is time delayed until after switching transitions are substantially complete.

10. In an output driver circuit for generating an output signal and having a steady state output circuit coupled to an output for generating a first portion of the output signal and a switching transition output circuit comprising first and second transistors forming a first complementary MOS transistor pair output stage and having a diode coupled between each transistor of the first complementary MOS transistor pair and an output, a compensation circuit comprising:
   third and fourth transistors forming a second complementary MOS transistor pair, the third transistor being coupled in parallel to one diode, the fourth transistor being coupled in parallel to the other diode, the gates of each of the third and fourth transistors being coupled to the output and the back gate of one of the third and fourth transistors being coupled to the output, wherein the second complementary pair provides an additional portion of the output signal during switching transitions of the output signal.

11. The output driver circuit of claim 10 wherein both the third and fourth transistor have a back gate coupled to the output.

12. The output driver circuit of claim 11 wherein the first and third transistors are PMOS transistors and the second and fourth transistors are NMOS transistors.

13. The output driver circuit of claim 12 wherein the third transistor has a back gate coupled to the output and the back gate of the fourth transistor is coupled to the reference voltage source.

14. The output driver circuit of claim 10 further comprising fifth and sixth transistors forming a third complementary MOS transistor pair, the fifth transistor being coupled between the voltage supply and the output, the sixth transistor being coupled between the output and the reference voltage supply.

15. The output driver circuit of claim 14 wherein the third complementary MOS transistor pair comprise the steady state output circuit.

16. In an output driver circuit having first and second transistors forming a first complementary MOS transistor pair output stage and having a diode coupled between each transistor of the first complementary MOS transistor pair and an output, a compensation circuit comprising:
   third and fourth transistors forming a second complementary MOS transistor pair, the third transistor being coupled in parallel to one diode, the fourth transistor being coupled in parallel to the other diode, the gates of each of the third and fourth transistors being coupled to the output and the back gate of one of the third and fourth transistors being coupled to the output;
   fifth and sixth transistors forming a third complementary MOS transistor pair, the fifth transistor being coupled between the voltage supply and the output, the sixth transistor being coupled between the output and the reference voltage supply; and
   seventh and eighth transistors forming a fourth complementary MOS transistor pair, the seventh transistor being coupled between the voltage supply and the output, the eight transistor being coupled between the output and the reference voltage supply.

17. The output driver circuit of claim 16 wherein the fourth complementary MOS transistor pair have an output impedance which is matched to the load.

18. The output driver circuit of claim 17 wherein an output of the third complementary MOS transistor pair is time delayed until after switching transistors are substantially complete.

19. A method of compensating an output signal generated by a complementary MOS transistor output stage of a driver during switching transitions comprising:
   providing a MOS transistor coupled between one transistor of the output stage and an output terminal;
   biasing the MOS transistor at a gate thereof with voltage at the output terminal;
   controlling the $V_T$ of the MOS transistor as a function of the voltage at the output terminal, where $V_T$ is the threshold voltage.

20. The method of claim 19 wherein the $V_T$ of the MOS transistor is controlled by coupling a back gate thereof to the output terminal.

* * * * *